US006183936B1

(12) United States Patent
Watkiss

(10) Patent No.: US 6,183,936 B1
(45) Date of Patent: Feb. 6, 2001

(54) METHOD OF PREPARING A LITHOGRAPHIC PRINTING PLATE

(75) Inventor: Philip John Watkiss, Leeds (GB)

(73) Assignee: Agfa-Gevaert, N.V., Mortsel (BE)

( * ) Notice: Under 35 U.S.C. 154(b), the term of this patent shall be extended for 0 days.

(21) Appl. No.: 09/445,074

(22) PCT Filed: Jun. 3, 1998

(86) PCT No.: PCT/EP98/03481

§ 371 Date: Feb. 7, 2000

§ 102(e) Date: Feb. 7, 2000

(87) PCT Pub. No.: WO98/55309

PCT Pub. Date: Dec. 10, 1998

(30) Foreign Application Priority Data

Jun. 3, 1997 (GB) .................................................. 9711385

(51) Int. Cl.$^7$ ................................. G03F 7/36; G03F 7/40
(52) U.S. Cl. ....................... 430/302; 430/201; 430/273.1; 430/278.1; 430/616; 430/964; 430/330
(58) Field of Search ..................................... 430/201, 204, 430/616, 273.1, 278.1, 964, 302, 330

(56) References Cited

U.S. PATENT DOCUMENTS

| 4,361,639 | * | 11/1982 | Kanada | 430/204 |
| 4,567,131 | * | 1/1986 | Watkiss | 430/204 |
| 5,401,611 | * | 3/1995 | Edwards et al. | 430/616 |
| 5,783,364 | * | 7/1998 | Ellis et al. | 430/302 |
| 5,807,658 | * | 9/1998 | Ellis et al. | 430/201 |

FOREIGN PATENT DOCUMENTS

| 3235871 | * | 7/1983 | (DE) . |
| 131462 | * | 1/1985 | (EP) . |
| 529163 | * | 3/1993 | (EP) . |
| 609941 | * | 8/1994 | (EP) . |
| 628409 | * | 12/1994 | (EP) . |
| 52-037104 | * | 3/1977 | (JP) . |
| WO 98/55309 | * | 12/1998 | (WO) . |

* cited by examiner

Primary Examiner—Richard L. Schilling
(74) Attorney, Agent, or Firm—Breiner & Breiner

(57) ABSTRACT

A method of preparing a lithographic printing plate which involves providing a plate precursor comprising a grained and anodized aluminium substrate coated with a metallic silver layer, imagewise exposing the precursor by means of a high intensity laser beam, and treating the plate by chemical and mechanical means in order to remove stains on the plate surface. On exposure of the plate precursor, removal of the metallic silver layer occurs in the exposed areas. The method provides press ready plates free of background stain, which give a clean, even appearance in exposed areas and show high image resolution and excellent durability on press, while eliminating the requirement for the use of intermediate film and developer chemistry.

12 Claims, No Drawings

METHOD OF PREPARING A LITHOGRAPHIC PRINTING PLATE

Priority is claimed under 35 USC 119 based on United Kingdon applicaton 9711385.6 filed Jun. 3, 1997 and priority is claimed based on PCT application PCT/EP98/03481 filed Jun. 3, 1998.

This invention relates to the formation of images directly from electronically composed digital sources and is particularly concerned with the formation of images on lithographic printing plate precursors. More particularly, the invention relates to lithographic printing plate precursors which incorporate an imaging layer comprising metallic silver, and a method of preparing lithographic printing plates which does not require the use of chemical treatments.

Lithographic printing is a process of printing from surfaces which have been prepared in such a way that certain areas are capable of accepting ink (oleophilic areas), whereas other areas will not accept ink (oleophobic areas). The oleophilic areas form the printing areas while the oleophobic areas form the background areas.

Plates for use in lithographic printing processes may be prepared using a photographic material that is made imagewise receptive or repellent to ink upon photo-exposure of the photographic material and subsequent chemical treatment. However, this method of preparation, which is based on photographic processing techniques, involves several steps, and therefore requires a considerable amount of time, effort and expense.

Consequently it has, for many years, been a long term aim in the printing industry to form images directly from an electronically composed digital database, ie by a so-called "computer-to-plate" system. The advantages of such a system over the traditional methods of making printing plates are:

(i) the elimination of costly intermediate silver film and processing chemicals;
(ii) a saving of time; and
(iii) the ability to automate the system with consequent reduction in labour costs.

The introduction of laser technology provided the first opportunity to form an image directly on a printing plate precursor by scanning a laser beam across the surface of the precursor and modulating the beam so as to effectively turn it on and off. In this way, radiation sensitive plates comprising a high sensitivity polymer coating have been exposed to laser beams produced by water cooled UV argon-ion lasers and electrophotographic plates having sensitivities stretching into the visible spectral region have been successfully exposed using low powered air-cooled argon-ion, helium-neon and semiconductor laser devices.

Imaging systems are also available which involve a sandwich structure which, on exposure to a heat generating infra-red laser beam, undergoes selective (imagewise) delamination and subsequent transfer of materials. Such so-called peel-apart systems are generally used as replacements for silver halide films.

A digital imaging technique has been described in U.S. Pat. No. 4,911,075 whereby a so-called driographic plate which does not require dampening with an aqueous fountain solution to wet the non-image areas during printing is produced by means of a spark discharge. In this case, a plate precursor comprising an ink-repellent coating containing electrically conductive particles coated on a conductive substrate is used and the coating is ablatively removed from the substrate. Unfortunately, however, the ablative spark discharge provides images having relatively poor resolution.

It is known to improve this feature by the use of lasers to obtain high resolution ablation as described, for example, by P E Dyer in "Laser Ablation of Polymers" (Chapter 14 of "Photochemical Processing of Electronic Materials", Academic Press, 1992, p359–385). Until recently, imaging via this method generally involved the use of high power carbon dioxide or excimer lasers. Unfortunately, such lasers are not well-suited to printing applications because of their high power consumption and excessive cost, and the requirement for high pressure gas handling systems. Recent developments have, however, led to the availability of more suitable infra-red diode lasers, which are compact, highly efficient and very economical solid state devices.

High power versions of such lasers, which are capable of delivering up to 3000 $mJ/cm^2$, are now commercially available.

Coatings which may be imaged by means of ablation with infra-red radiation have previously been proposed. Thus, for example, a proofing film in which an image is formed by imagewise ablation of a coloured layer on to a receiver sheet is described in PCT Application No 90/12342. This system is, however, disadvantageous in requiring a physical transfer of material in the imaging step, and such methods tend to give rise to inferior image resolution.

Much superior resolution is obtained by means of the ablation technique described in European Patent No 649374, wherein a driographic printing plate precursor is imaged digitally by means of an infra-red diode laser or a YAG laser, and the image is formed directly through the elimination of unwanted material. The technique involves exposing a plate precursor, incorporating an infra-red radiation ablatable coating covered with a transparent cover sheet, by directing the beam from an infra-red laser at sequential areas of the coating so that the coating ablates and loses its ink repellancy in those areas to form an image, removing the cover sheet and ablation products, and inking the image.

A heat mode recording material is disclosed in U.S. Pat. No. 4,034,183 which comprises an anodised aluminium support coated with a hydrophilic layer. On imagewise exposure using a laser, the exposed areas are rendered hydrophobic, and thereby accept ink.

Japanese patent application laid open to public inspection No 49-117102 (1974) discloses a method for producing printing plates wherein a metal is incorporated in the imaging layer of a printing plate precursor which is imaged by irradiation with a laser beam modulated by electric signals. Typically, the plate precursor comprises a metal base, such as aluminium, coated with a resin film, which is typically nitrocellulose, and on top of which has been provided a thin layer of copper. The resin and metal layers are removed in the laser-struck areas, thereby producing a printing plate. The disadvantage of this system, however, is that two types of laser beam irradiation are required in order to remove firstly the copper (eg by means of an argon-ion laser) and then the resin (eg with a carbon dioxide laser); hence, the necessary equipment is expensive.

Subsequently a method of printing plate production which obviated the requirement for a second laser exposure was disclosed in Japanese patent application laid open to public inspection No 52-37104 (1977). Thus, a printing plate precursor comprising a support, typically aluminium, an anodic aluminium oxide layer, and a layer of brass, silver, graphite or, preferably, copper is exposed to a laser beam of high energy density in order to render the exposed areas hydrophilic to yield a printing plate. The printing plate precursor is, however, of rather low sensitivity and requires the use of a high energy laser for exposure.

An alternative heat mode recording material for making a lithographic printing plate is disclosed in European Patent No 609941, which comprises a support having a hydrophilic surface, or provided with a hydrophilic layer, on which is coated a metallic layer, on top of which is a hydrophobic layer having a thickness of less than 50 nm. A lithographic printing plate may be produced from the said material by imagewise exposing to actinic radiation, thereby rendering the exposed areas hydrophilic and repellent to greasy ink.

Conversely, European Patent No 628409 discloses a heat mode recording material for making a lithographic printing plate which comprises a support and a metallic layer, on top of which is provided a hydrophilic layer having a thickness of less than 50 nm. A lithographic printing plate is produced by imagewise exposing the material to actinic radiation in order to render the exposed areas hydrophobic and receptive to greasy ink.

In each of the two foregoing heat mode recording materials, however, difficulties in printing will be encountered. On exposure of the materials to actinic radiation, the energy is converted to heat in the image areas by interaction with the metallic layer, thereby destroying the hydrophilicity or hydrophobicity—depending on the material employed—of the topmost layer in those areas. Consequently, the surface of the metallic layer becomes exposed, and the success of the printing operation is dependent upon differences in hydrophilicity and oleophilicity between the metallic surface and the hydrophilic or hydrophobic layer, as the case may be. Since the metallic layer functions as the hydrophobic surface in one case, and as the hydrophilic surface in the alternative case, it would be expected that such differences in hydrophilicity and oleophilicity would not be sufficiently clearly defined so as to provide a satisfactory printing surface. Furthermore, when a hydrophilic layer is present, and the metallic surface functions as the oleophilic areas of the plate, image areas will necessarily be printed from the metallic surface; such an arrangement is known to be unsatisfactory, and to result in difficulties in achieving acceptable printing quality.

It is an object of the present invention to provide a lithographic printing plate having excellent printing properties, and a method of making said plate which obviates the requirement for the use of processing developers after exposure.

It is a further object of the present invention to provide a method of preparing a lithographic printing plate which does not require the use of costly intermediate film and relies on direct-to-plate exposure techniques.

It is a still further object of the present invention to provide a method of producing a lithographic printing plate in which a high quality image results from the ablation of a metallic layer from a hydrophilic support, thus providing a high degree of differentiation between hydrophilic and oleophilic areas.

Specifically, in the case of the present invention, the metallic layer is silver and ablation of the layer in non-image areas is achieved by heat mode exposure to a beam of radiation, preferably generated by a laser.

It has been observed, however, that thermally exposed silver-based plates tend to produce a yellow to red coloured stain in exposed areas, and the degree of staining increases as the energy of the exposure increases. The stain comprises silver which is redeposited on the plate from the ablated silver, and the redeposited material is sufficiently well adhered that it cannot be removed by means of simple water or detergent washing.

Despite comprising no more than 5% by weight of the original silver layer, the redeposited silver produces a significant cosmetic defect. Additionally, it hinders the accuracy of densitometric measurements which are often required prior to committing a plate to running on a printing press. Generally, however, the printing performance of the plate on press is not deleteriously affected.

It is, therefore, an additional objective of the present invention to provide a lithographic printing plate which is free from such stains and the associated cosmetic defects and performance problems.

It is also an objective of the present invention to provide a method of removing said stains by means of chemical and mechanical treatments which method has no adverse effect on the fine detail of the printing image and does not compromise the durability—and hence the length of the print run—of the plate on press.

According to the present invention, there is provided a method of preparing a lithographic printing plate, said method comprising:

(a) providing a lithographic printing plate precursor comprising:
(i) a grained and anodised aluminium substrate having coated thereon
(ii) a metallic silver layer;
(b) imagewise exposing said precursor by means of a high intensity laser beam; and
(c) treating the plate by chemical and mechanical means in order to remove stains on the plate surface.

Specifically, the chemical and mechanical treatment comprises treatment with an oxidising agent which is capable of forming a substantially insoluble silver compound which may then be removed by physical means, involving gentle mechanical agitation.

In particular, it is found that mercapto compounds, which are typically used as oleophilising agents for use in conjunction with silver diffusion transfer products, are especially useful in this regard. Typical examples of said mercapto compounds include alkyl or aryl mercapto derivatives of triazoles, oxadiazoles and tetrazoles.

Effective mechanical means of assisting in the removal of the stain can be provided by the application of a scrubbing action associated with the use of a rotating brush or roller covered with a plush fabric material, or by means of high pressure water jets. As the plush fabric material, use may be made of various products, including polyester, nylon or acrylic fibres, or mixtures of these materials.

Advantageously, the oxidising agents are applied in combination with other additives, including enzymes, surfactants, typically anionic surfactants, metal sequestering agents, for example ethylenediaminetetraacetic acid, and buffering agents such as citrates, phosphates, tris (hydroxymethyl)aminomethane or triethanolamine, giving a pH of between 6 and 11, preferably between 7 and 9.

Typically, the chemical means would comprise from 0.05% to 10% (preferably 0.1% to 0.5%) by weight of oxidising agent, from 0.5% to 10% (preferably 1% to 5%) by weight of surfactant, and from 0.5% to 10% (preferably from 1% to 5%) by weight of metal sequestering agent.

Since the stain produced on the lithographic printing plate precursors used in the method of the present invention comprises silver, it is possible to use alternative oxidising agents of the type used commercially in colour photographic processing as described, for example, in "Modern Photographic Processing" Volume 2, by G Haist, 5 John Wiley and Sons Inc, 1979; such oxidising agents could include, for example, ceric salts, or hypochlorite bleach or other commercially available bleach solutions.

Unfortunately, however, such oxidising agents oxidise the silver to soluble ionic silver salts and, therefore, oxidation of the image will continue after the stain has been removed by oxidation by virtue of the dissolving action. Consequently, the use of such oxidising agents is fraught with problems, since the oxidising action is difficult to control, and damage to the image areas easily occurs if great care is not taken.

Conversely, the oxidising agents used in the method of the present invention readily form complexes with silver which are substantially insoluble compounds. Hence, the continuation of the oxidation process is effectively inhibited. Thus, such oxidising agents do not cause damage to image areas, and are much more readily and effectively applied in the method described.

It is known that said oxidising agents do not cause total oxidation of the silver to be removed but, rather, chemically react with the surface of the fine silver particles comprising the stain, thereby weakening the adhesion between the silver and the substrate. Therefore, the additional application of mechanical means of removal of the stain-forming material is a requirement of the present invention.

The substrate employed in the present invention is an aluminium substrate which has been electrochemically grained and anodised on at least one surface in order to enhance its lithographic properties. Optionally, the aluminium may be laminated to other materials, such as paper or various plastics materials, in order to enhance its flexibility, whilst retaining the good dimensional stability associated with aluminium.

The metallic silver layer which is applied to the grained and anodised surface of the aluminium has a thickness which preferably lies in the range of from 20 nm to 200 nm, most preferably from 40 nm to 100 nm.

Various techniques are available for the application of the silver layer to the grained and anodised aluminium substrate, including vapour or vacuum deposition or sputtering. However, the most preferred method for applying the layer involves the treatment of a silver halide photographic material according to the silver salt diffusion transfer process.

In the diffusion transfer process, a silver halide emulsion layer is transformed, by treatment with a so-called silver halide solvent, into soluble silver complex compounds which are then allowed to diffuse into an image receiving layer and are reduced therein by means of a developing agent, generally in the presence of physical development nuclei, to form a metallic silver layer.

Two such systems are available: a two sheet system in which a silver halide emulsion layer is provided on one element and a physical development nuclei layer is provided on a second element, the two elements being placed in contact in the presence of developing agent(s) and silver halide solvent(s) in the presence of an alkaline processing liquid and subsequently peeled apart to provide a metallic silver layer on the second element; and a single sheet system wherein the element is provided with a physical development nuclei layer, a silver halide emulsion layer being provided on top thereof, the element being treated with developing agent(s) and silver halide solvent(s) in the presence of an alkaline processing liquid and the element being washed to remove spent emulsion layer and leave a metallic silver layer which is formed in the layer containing physical development nuclei.

Alternatively, the diffusion transfer process may be used to apply a metallic silver layer by overall exposing a positive working silver halide emulsion layer to form a latent negative image which is then developed in contact with a physical development nuclei layer to form a metallic silver layer. Again, the process may be carried out using either a single sheet or a double sheet system.

The principles of the silver complex diffusion transfer process are fully described in the publication "Photographic Silver Halide Diffusion Processes" by Andre Rott and Edith Weyde, The Focal Press, London and New York, 1972, and further detail may be gleaned by reference thereto.

In the case of the present invention, a diffusion transfer material of the single sheet type is most preferably used, and the silver layer is preferably formed by treatment of the material with developing agent(s) and silver halide solvent (s) in the presence of an alkaline processing liquid.

The printing plate precursor is imaged by a beam of radiation, preferably from a laser operating in the infra-red region of the spectrum. Examples of suitable infra-red lasers include semiconductor lasers and YAG lasers, for example the Gerber Crescent 42T Platesetter with a 10 W YAG laser outputting at 1064 nm. Exposure to the beam of radiation causes ablation of the metallic layer to occur in the radiation-struck areas.

Following exposure, and treatment with an oxidising agent as hereinbefore described, the plate is ready for printing operations. Optionally, however, the plate may then be treated with desensitising gums or compositions comprising proteolytic enzymes, for example trypsin or bacterial proteases, oleophilising agents: such as cationic surfactants, and desensitising compounds, including sodium hexametaphosphate, in order to ensure good start-up on press.

The method of the present invention provides printing plates free of background stain which give a clean, even appearance in exposed areas. The plates show high image resolution and excellent durability on press, and eliminate the requirement for the use of costly intermediate film and developer chemistry and the attendant inconvenience resulting from the use of these materials.

The following example is illustrative of the invention, without placing any limit on the scope thereof:

EXAMPLE

Samples of a commercially available Howson SILVER-LITH® SDB printing plate, supplied by DuPont Printing and Publishing, were processed without exposure through an automatic processor by means of the diffusion transfer reversal method, in accordance with the recommendation of the manufacturer, except that water, rather than the specified finishing gum, was applied in the finisher section. The resulting printing plate precursors comprised a grained and anodised aluminium substrate, on the anodised surface of which was coated a layer of silver.

The plate precursors were separately loaded onto a Gerber Crescent 42T internal drum Laser Platesetter fitted with an extraction system comprising a curved nozzle about 1 cm from the plate surface, an air suction pump and a 0.3 $\mu$HEPA filter for removal of ablation debris and imagewise exposed to a 10W YAG laser outputting at a wavelength of 1064 nm and peak power density of 6.5 MW/cm$^2$ to ablatively remove the silver in background areas and thereby create an image.

The plates produced had images showing good resolution and capable of producing long print runs on press. However, the background non-image areas showed a yellow stain which would not be generally acceptable in the printing industry.

Chemical treatment solutions were prepared as detailed in Table 1 and applied to the plate samples. Subsequently, the plates were mounted on a Drent Web Offset Printing press and prints were produced.

The effects of the chemical treatments are shown in Table 1, together with details of the durability of the plates during the press run. It can be seen that the plates produced according to the method of the present invention are free from stain but show no impairment in press performance.

TABLE 1

| Solution Formula | Agitation Method | Stain | Reflection Density | Dot Resolution 2540 dpi screen | Press Durability (No of copies) |
|---|---|---|---|---|---|
| water | none | yes | 0.15 | 1 to 99% | 80K |
| water | rotating brush | yes | 0.13 | 1 to 99% | 80K |
| 0.1% PMT, pH 5 with TEA + Citric acid | none | yes | 0.11 | 1 to 99% | 80K |
| 0.1% PMT, pH 5 with TEA + Citric acid | rotating brush | slight | 0.08 | 1 to 99% | 80K |
| 0.1% PMT, pH 9 with TEA + Citric acid | rotating brush | none | 0.05 | 1 to 99% | 80K |
| 0.1% PMT, pH 9 with TEA + Citric acid | none | yes | 0.10 | 1 to 99% | 80K |
| 0.2% OMT, pH 9 with TEA + Citric acid | rotating plush-covered roller | none | 0.06 | 1 to 99% | 80K |
| 0.2% OMT, pH 9 with TEA + Citric acid + 3% Lutensit AP-S ® | rotating plush-covered roller | none | 0.03 | 1 to 99% | 80K |
| 0.2% OMT, pH 9 with TEA + Citric acid + 1% EDTA-$Na_4$ | rotating plush-covered roller | none | 0.04 | 1 to 99% | 80K |
| 1% ceric ammonium nitrate | none | none | 0.04 | 4 to 96% | 30K |

PMT = 5-phenyl-1-mercapto-2,3,4,5-tetrazole
OMT = 5-octyl-1-mercapto-2,3,4,5-tetrazole
TEA = Triethanolamine
Lutensit AP-S ® is a commercial anionic surfactant

What is claimed is:

1. A method of preparing a lithographic printing plate, said method comprising:
   (a) providing a lithographic printing plate precursor comprising:
      (i) a grained and anodised aluminium substrate having coated thereon;
      (ii) a metallic silver layer;
   (b) imagewise exposing said precursor by means of a high intensity laser beam; and
   (c) treating the plate by chemical and mechanical means in order to remove stains on the plate surface.

2. A method as defined in claim 1 wherein said metallic silver layer is applied by means of the silver salt diffusion transfer process.

3. A method as defined in claim 1 or 2 wherein said metallic silver layer has a thickness of from 20 nm to 200 nm.

4. A method as defined in claim 1, 2 or 3 wherein said treatment by chemical means comprises treatment with an oxidising agent.

5. A method as defined in claim 4 wherein said oxidising agent comprises a mercapto compound.

6. A method as defined in claim 5 wherein said mercapto compound comprises an alkyl or aryl mercapto derivative of a triazole, oxadiazole or tetrazole.

7. A method as defined in claim 4, 5 or 6 wherein said oxidising agent is applied in combination with at least one of an enzyme, a surfactant, a metal sequestering agent and a buffering agent.

8. A method as defined in claim 7 wherein said surfactant comprises an anionic surfactant, said sequestering agent comprises ethylenediaminetetraacetic acid, and said buffering agent comprises a citrate or phosphate salt, giving a pH of between 6 and 11.

9. A method as defined in claim 7 or 8 wherein said chemical means comprises from 0.05% to 10% by weight of oxidising agent, from 0.5% to 10% by weight of surfactant, and from 0.5% to 10% by weight of metal sequestering agent.

10. A method as defined in claims 1–9 wherein said treatment by mechanical means comprises the application of a scrubbing action by means of a rotating brush or roller covered with a plush fabric material.

11. A method as defined in claims 1–9 wherein said treatment by mechanical means comprises the use of high pressure water jets.

12. A method as defined in claims 1–11 wherein, following said treatment by chemical and mechanical means, said plate is treated with a solution comprising a proteolytic enzyme, a silver oleophilising agent and a desensitising compound.

\* \* \* \* \*